(12) United States Patent
Waghray et al.

(10) Patent No.: US 7,959,973 B2
(45) Date of Patent: Jun. 14, 2011

(54) PRESSURE SWING CVI/CVD

(75) Inventors: Akshay Waghray, Granger, IN (US);
Terence B. Walker, South Bend, IN (US)

(73) Assignee: Honeywell International Inc., Morristown, NJ (US)

( * ) Notice: Subject to any disclaimer, the term of this patent is extended or adjusted under 35 U.S.C. 154(b) by 1086 days.

(21) Appl. No.: 11/605,383

(22) Filed: Nov. 29, 2006

(65) Prior Publication Data

US 2008/0124462 A1    May 29, 2008

(51) Int. Cl.
C23C 16/00    (2006.01)
(52) U.S. Cl. .............. 427/249.2; 427/249.1; 427/249.3; 427/255.24
(58) Field of Classification Search .............. 427/248.1, 427/249.1, 249.2, 249.3, 255.23
See application file for complete search history.

(56) References Cited

U.S. PATENT DOCUMENTS

| 4,580,524 | A | 4/1986 | Lackey, Jr. et al. |
| 5,348,774 | A | 9/1994 | Golecki et al. |
| 5,411,763 | A | 5/1995 | Weaver et al. |
| 5,904,957 | A | 5/1999 | Christin et al. |
| 6,001,419 | A * | 12/1999 | Leluan et al. ............. 427/249.2 |
| 6,197,374 | B1 * | 3/2001 | Huttinger et al. ......... 427/249.2 |
| 2004/0113302 | A1 | 6/2004 | La Forest et al. |
| 2006/0046059 | A1 | 3/2006 | Arico et al. |
| 2006/0263525 | A1 * | 11/2006 | Sion et al. ................. 427/249.2 |

FOREIGN PATENT DOCUMENTS

| DE | 41 42 261 A1 | 6/1993 |
| EP | 1 728 889 A2 | 12/2006 |
| WO | 96/31447 A1 | 10/1996 |
| WO | WO-98/27023 A1 | 6/1998 |
| WO | WO 2004097065 A2 * | 11/2004 |

OTHER PUBLICATIONS

I. S. OH et al.; "Effects of pressure on the pore formation of carbon/carbon composites during carbonization"; Journal of Materials Science 34; 1999; pp. 4585-4595.
Examination Report from corresponding EP Application No. 07 121 699.8, mailed Aug. 11, 2010, 5 pages.
European Search Report from corresponding EP Application No. 07121699.8, mailed Jul. 29, 2010, 3 pages.

* cited by examiner

Primary Examiner — David Turocy
(74) Attorney, Agent, or Firm — Shumaker & Sieffert, P.A.

(57) ABSTRACT

Method of chemical vapor infiltration of a deposable carbon material into a porous carbon fiber preform in order to densify the carbon fiber preform. The method includes the steps of: situating the porous carbon fiber preform in the reaction zone; providing a linear flow of a reactant gas comprising deposable carbon material in the reaction zone at an initial reaction pressure of at most 50 torr to produce deposition of the deposable carbon material into the preform; and adjusting the pressure of the gas to reaction pressures lower than said initial reaction pressure while deposable carbon material continues to be deposited into the porous carbon fiber preform. This method enables attainment of a target increased density in a carbon fiber preform much more quickly than known processes. A programmed pressure swing throughout the CVI/CVD run may be set in order to provide a linear increase in density. Alternatively, step changes in pressure during the course of the densification process may be made to enhance the rate of densification. This method reduces the number of cycles and the required intermediate machining steps necessary to densify preforms.

10 Claims, 7 Drawing Sheets

PRESSURE SWING CVI/CVD

The invention concerns methods of chemical gas phase infiltration in the manufacture of carbon-carbon composite preforms intended for use in applications such as aircraft landing systems.

BACKGROUND OF THE INVENTION

Deposition of solid phases on substrates by decomposition of volatile or gaseous compounds which contain the solid phase elements is generally referred to as chemical vapor deposition. If this deposition takes place in the open pores of a porous substrate or in the cavities of a porous structure, then it is often referred to as chemical vapor infiltration. Chemical vapor deposition (CVD) and chemical vapor infiltration (CVI) allow a densification of structure or, when the porous structure consists of fibers, an introduction of a matrix and, with this, the production of composite, strengthened fiber materials. Both chemical vapor deposition as well as chemical vapor infiltration are extremely complex processes.

In chemical gas phase infiltration, the volatile or gaseous starting compounds must be transported into the depths of the pores before conversion to the solid matrix. If decomposition of the volatile or gaseous starting compounds, and formation of the solid phase, occurs in the gas phase and on the surface of the porous structure in or near the entrances of the pores, the pores become clogged. The pores are then not filled, which defeats the whole aim of the process.

Various conventional methods for CVI/CVD processing are known. Procedurally, the simplest methods to perform are isobaric and isothermic chemical vapor infiltrations. In these conventional methods, the entire process space exists at constant temperature and pressure. Here, however, only very low pressures or partial pressures of educt gases can be used, when necessary with addition of inert or dilution gases, so that extremely long infiltration times are required. Optimal or maximal pore filling is generally thought to be possible only at extremely slow deposition or infiltration rates.

In order to successfully bring about infiltration, low pressures, in particular, low partial pressures of reactant gases, have been used. The pressures realized under the conditions of industrially applied chemical vapor infiltration are at least one to two orders of magnitude below normal pressure. Starting compounds are partially mixed with inert gases so that their partial pressures, and with it their deposition rates, can be further lowered. Due to the low partial pressures, extremely long infiltration times of up to several weeks are required.

In vacuum pressure pulsation methods, the process pressure is continually pulsed, presumably to support diffusion. Significant disadvantages of this method include the cost of the apparatus as well as the filtration times, which are still very long.

Another well-known method is the temperature gradient method, described for instance in U.S. Pat. No. 5,411,763 and U.S. Pat. No. 5,348,774. In this method, heat is removed from the side of the porous substrate facing the process gas stream by suitable measures, for example by cooling by the stream. The side of the porous substrate opposite to the gas stream is adjacent to a heating element. In this way a temperature gradient crucial to the method is established normal to the surface of the substrate. The surface temperature on the cold side is adjusted with the gas stream such that no, or at least very little, deposition takes place. This avoids narrowing of the pores in the region. A disadvantage of this method is the very high gas throughput necessary for cooling. The low yield of deposited material entails long production times. Much equipment is needed for the heating.

DE 41 42 261 teaches CVI/CVD methods in which the gas is streamed through the porous substrate on the basis of forced convection whereby a pressure gradient is established. The infiltration time can be kept relatively short. After a certain level of pore filling however, the streaming through of the porous structure becomes more difficult.

From U.S. Pat. No. 4,580,524, teaches a CVI/CVD method whereby temperature and pressure gradient techniques are combined with one another. In this way relatively short production times can be achieved. The disadvantage of such a method is the complicated reactor construction.

Huttinger (U.S. Pat. No. 6,197,374 B1) describes an isothermal method for chemical vapor infiltration of porous refractory materials. The infiltration takes place under isobaric conditions, e.g. the porous structure to be infiltrated is streamed with a gas in a reaction zone, but is not subjected to a flow through such that an appreciable pressure gradient is formed. In this patent, the gas pressure or the partial pressure of an educt gas contained within the gas and the persistence of the gas in the reaction zone are adjusted for the prescribed temperature in the reaction zone such that in the porous structure a deposition reaction in the pressure and partial pressure region of the saturation adsorption of the gaseous and volatile compounds forming the solid phase exists. The gas pressure or the partial pressure of an educt gas contained within the gas and the persistence of the gas in the reaction zone are adjusted for the prescribed temperature so that the transformation of the educt gas is limited such that in the flow through of the reaction zone no more than 50% of the solid-forming elements introduced into the educt gas are deposited in the porous structure. In addition, the porous structure is subjected to flow-through gas linearly from the bottom to the top through apertures of substantially identical width from 1 to 50 mm. In this process, substantially higher pressures and partial pressures of the educt gas are set compared to conventional method. These higher pressures are said by the Huttinger patent to be higher than those of known isobaric, isothermal methods, in order to enable high or the highest possible deposition rates.

The Huttinger patent teaches that in order to simultaneously achieve good pore filling while applying high pressure at the same time, very special reaction control is required, and the choice of starting compound is of special importance. Methane or natural gas alone often find preferred implementation in the chemical vapor infiltration processes of carbon due to the fact that they are inexpensive.

U.S. Pat. No. 6,197,374 B1 teaches that the combination according to its invention of high pressures on the one hand and low deposition rates on the other has the effect that chemical vapor deposition according to the method of its invention attains a combination of high production speed and a high extent of pore filling. The patent teaches further that according to its invention the gas flow to which the porous structure is subjected may contain a significant portion of inert or dilution gas, e.g. nitrogen, argon, etc., but that preferably no inert or dilution gas is added to the gas. Natural gases which by nature contains a small amount of inert or dilution gas can be used, but no additional inert or natural gas should be added to lower the partial pressure of the starting materials.

The disclosure of the Huttinger patent may be summarized as follows: "Decisive for the method according to the invention are therefore the right choice of starting materials, high pressures and especially high partial pressures of the starting materials and low temperatures". U.S. Pat. No. 6,197,374 B1, column 8, lines 8-11.

SUMMARY OF THE INVENTION

The present invention employs low pressures in a way that enables the length of the CVI/CVD process to be dramatically shortened. In accordance with the present invention, the initial pressure is no greater than 50 torr, and that low pressure is reduced even lower as the reaction proceeds, finishing as low as 10 torr. The "low→lower" approach of the present invention provides a more constant rate of densification as compared to a process which uses a constant, high pressure. This approach enables attainment of a target increased density in a carbon fiber preform much more quickly than known processes. This invention may set a programmed pressure swing throughout the CVI/CVD run in order to provide a linear increase in density. Alternatively, this invention may make step changes in pressure during the course of the densification process to enhance the rate of densification. This invention reduces the number of cycles and the required intermediate machining steps necessary to densify preforms.

This invention provides a method of chemical vapor infiltration of a deposable carbon material into a porous carbon fiber preform in order to densify the carbon fiber preform. The method of this invention includes the steps of: situating the porous carbon fiber preform in the reaction zone; providing a linear flow of an reactant gas comprising deposable carbon material in the reaction zone at an initial reaction pressure of at most 50 torr to produce deposition of the deposable carbon material into the preform; and adjusting the pressure of the gas to reaction pressures lower than said initial reaction pressure while deposable carbon material continues to be deposited into the porous carbon fiber preform. There are two approaches to adjusting the pressure of the gas to lower reaction pressures in this densification method.

In one approach, the gas infiltration pressure during the chemical vapor infiltration is lowered at a rate defined by the formula $P(t)=N*e^{(-t/T)}+n$ torr, where $P(t)$ is the gas infiltration pressure in torr, $N$ is a number from 10 through 50 (e.g., 40) corresponding to the initial gas infiltration pressure, "e" is a the natural logarithm base, "t" is elapsed time since the start of the CVI/CVD process, "T" is the empirically-determined time at which infiltration gas diffusion rate rather than infiltration gas pressure begins to control the rate of density increase in the chemical vapor infiltration of the particular carbon fiber preform being densified, and n is a number $0<n<N$ (e.g., 10 when N is 40) corresponding to a degree of lowering of gas infiltration pressure during deposition of deposable carbon material into the porous carbon fiber preform.

In another approach, gas infiltration pressure during the chemical vapor infiltration is initially set at 20 torr, and is lowered to 10 torr at the time at which infiltration gas diffusion rate rather than infiltration gas pressure begins to control the rate of density increase in the chemical vapor infiltration of the particular carbon fiber preform being densified.

In the method of the present invention, linear flow of the gaseous deposable carbon material may conveniently be directed from the bottom to the top of the reaction zone. The reactant gas can be methane or natural gas, possibly further including propane gas. In such a case, the ratio by volume of methane or natural gas to propane gas will typically be greater than 5:1. The reactant gas may be free of admixed inert gas. In carrying out the present densification process, multiple porous carbon fiber preforms may be adjusted apart from one another in such a way as to provide widths of equal spacing therebetween. The temperature in the reaction zone can conveniently be set in the range 1000° C. to 1200° C., although other high temperatures can be used. Preferably, the linear flow of the deposition gas is adjusted to have a flow rate such that no more than 5% of the disposable material in the flowing gas is deposited into the porous carbon fiber preform.

BRIEF DESCRIPTION OF THE DRAWINGS

The present invention will become more fully understood from the detailed description given hereinbelow, and from the drawings that accompany this application. These drawings are not to scale, and are provided by way of illustration only. The drawings should not be construed as imposing limitations on the scope of the present invention.

DETAILED DESCRIPTION OF THE INVENTION

According to the present invention, low temperatures can be employed for vapor infiltration. According to a preferred embodiment, temperatures in the range of 1000 to 1200° C. are set in the reaction zone for vapor infiltration of carbon fiber preforms. Gas is passed over the porous structure which comprises a by-product generated during vapor infiltration. Preferably higher hydrocarbon enriching gases such as propane are added to the methane or natural gas primary reactant gas for vapor infiltration of the carbon fiber preform. The volume ratio of methane or natural gas to added enriching gas is typically more that 5:1.

In accordance with the present invention, low pressures or partial pressures must be used, especially pressures of at most 50 torr and as low as 10 torr.

The method according to the invention may be conducted in a reactor having a specific reactor construction, or at least in a reactor with a special mounting. Reactors of the type shown in U.S. Pat. No. 6,197,374 B1 may be used in the present invention. Since brake disks made of carbon fiber-reinforced carbon are among the most important products which are manufactured by chemical vapor infiltration in large quantity, specifically of carbon into carbon fiber structures, the principle of reactor construction or of the reactor components will be explained by the following example.

The fitted parts can be composed of ceramic material. Typically, however, carbon-carbon composite or graphite is used. The thickness of the fitted parts and the recesses correspond to the thickness and diameter of the brake discs. The starting material streams through the interstices, whose width is not represented to scale, between the fitted parts. Where there is a correspondingly small distance between the fitted parts, a very high speed can be achieved with a relatively small volume of flow and low tendency to form vortices. This is particularly important, since only a minimum turnover of the starting materials can be permitted due to the decomposition.

Figure 1A:
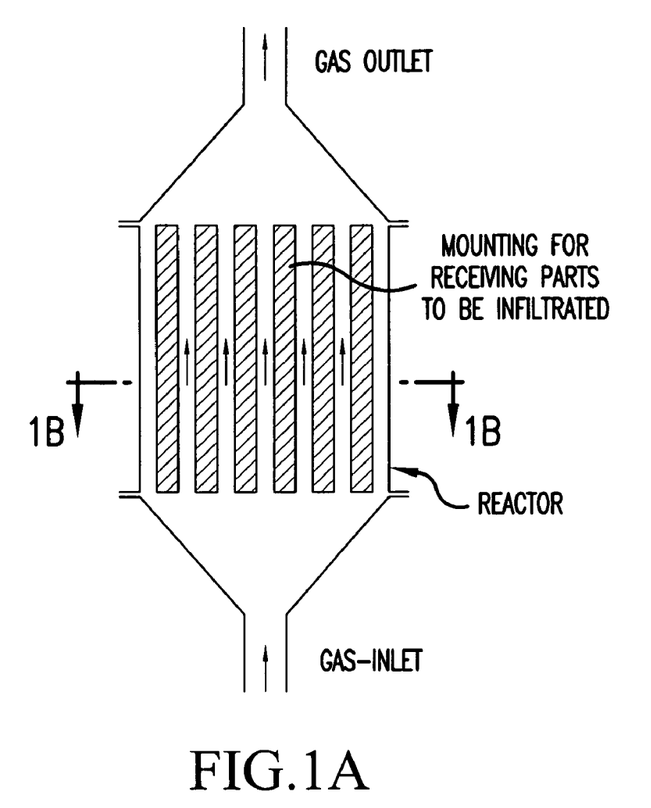
FIGS. 1A and 1B provide a schematic diagram of an infiltration reactor for parts with large diameter or length to thickness ratio.
Figure 1B:
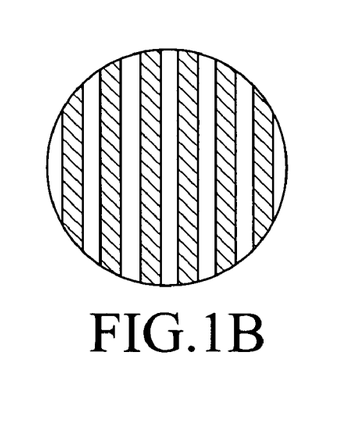
Figure 2:
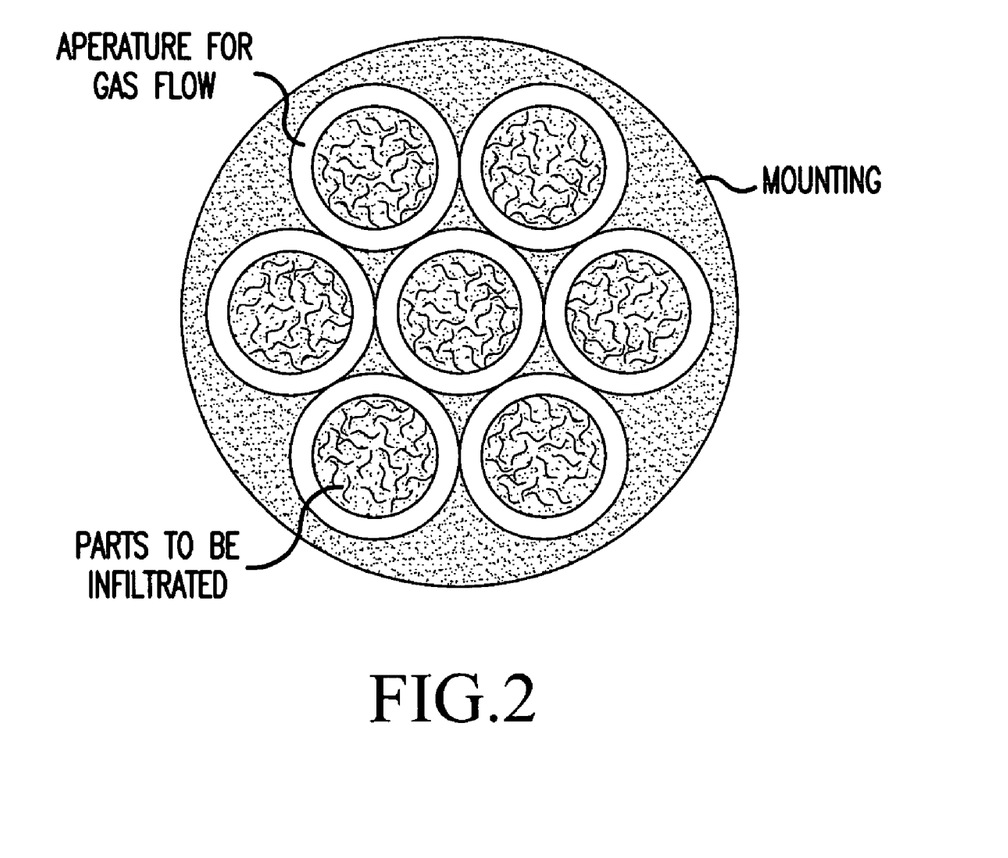
FIG. 2 is a horizontal section through the fitted part of the infiltration reactor for cylindrical parts with medium to small diameter/length to thickness ratio.

The design of the reactor according to FIG. 1 can always be used when relatively flat parts or when parts with large diameters or length to thickness ratio are to be infiltrated. If the task concerns the infiltration of parts with medium or small diameter/length to thickness ratio, then a reactor construction in accordance with FIG. 2 is appropriate for the method. FIG. 2 shows a horizontal cross section of the reactor. In this case the reactor construction is composed of a full material, preferably of carbon-carbon composite or graphite, with vertical pipes containing the parts which are to be infiltrated. The same construction can also be used when the radial infiltration of flat parts is favored instead of axial infiltration, for example in layers of fiber weaves.

Typical Reactors

Figure 3:
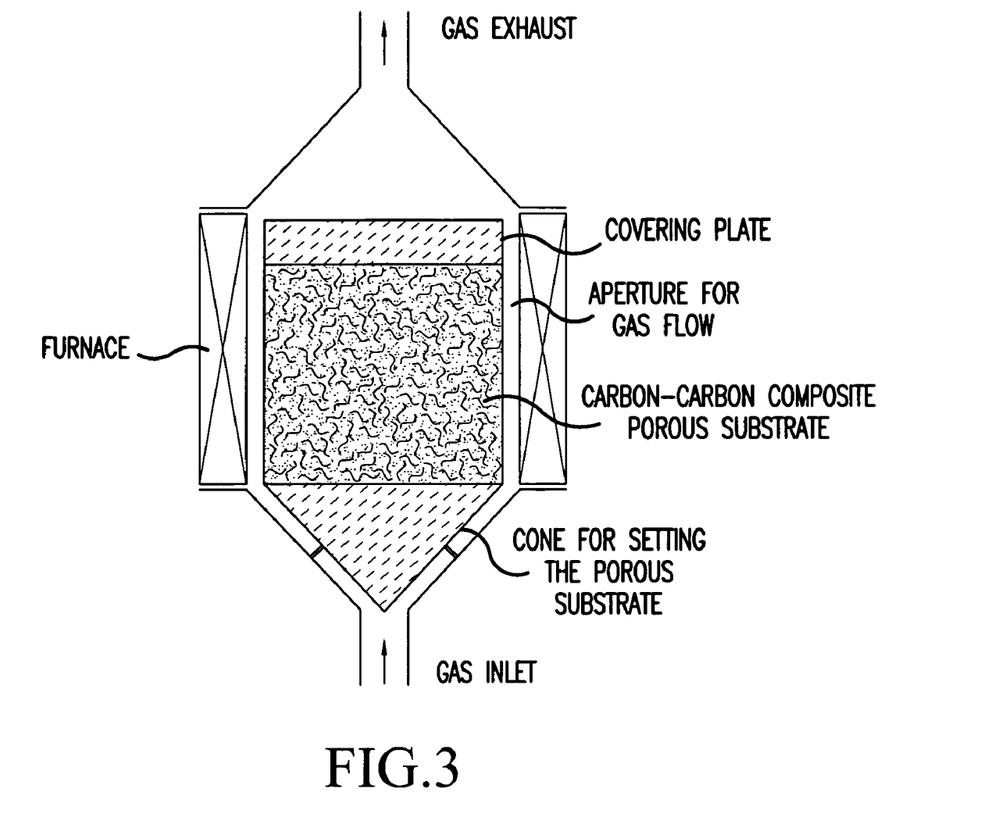
FIG. 3 is a schematic section through a simplified infiltration reactor.

A vertical short pipe reactor with conical inflow jet as illustrated in FIG. 2 may be used. FIG. 3 is a schematic sketch of the reactor. The cylindrical, porous substrate of carbon fiber preform material may have a diameter of 16 mm. The aperture between the carbon fiber preform and the reactor wall may have a thickness of 2 mm. The porous carbon fiber preform is positioned on a cone of solid ceramic standing in inverse position. At the top it is covered by a plate of solid ceramic in order to ensure an infiltration preferred in radial direction. The conical inflow jets make it possible for the starting gases to enter the cylindrical deposition part of the reactor practically in a non-decomposed state. A defined, vortex-free flow of the gas with a short direct contact time at medium gas flow is made possible by the vertical arrangement, the cone, and the concentrated arrangement of the cylinder with thin slots between the wall, the cone, and the cylindrical sample. The porous, cylindrical carbon fiber preform may have a diameter of 1.6 cm, a height of 2 cm, and a body density of 2.86 g/cm. It may be composed of an aluminum ceramic with an open porosity of 23.24%.

Figure 4:
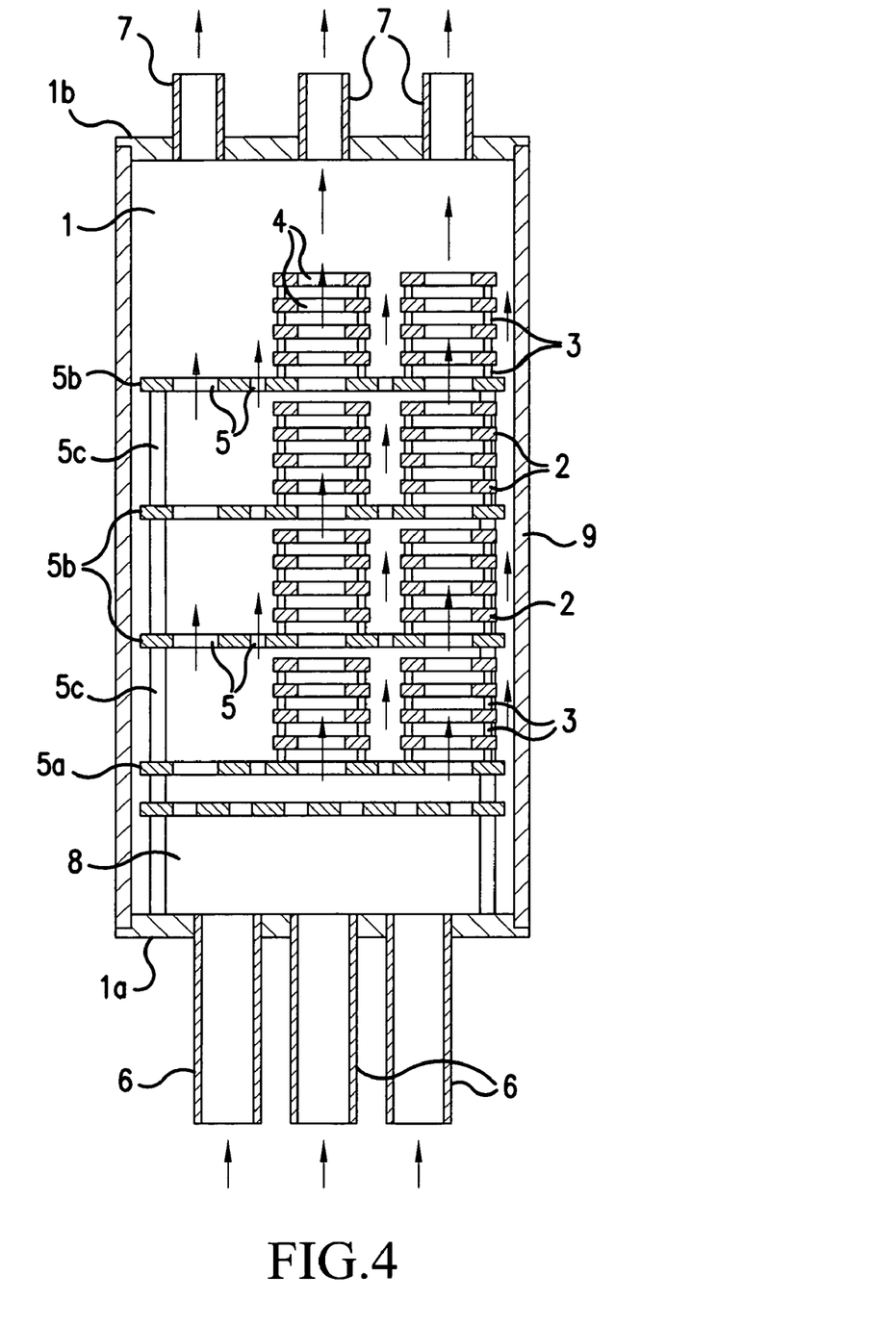
FIG. 4 is a schematic section through an industrial scale CVD/CVI reactor.

FIG. 4 is a diagram of a reaction chamber 1 of a chemical vapor infiltration installation. Chamber 1 is typically cylindrical in shape about a vertical axis. Annular fiber preforms 2, e.g. for manufacturing airplane brake disks made of carbon-carbon composite, are loaded into chamber 1 as illustrated. The preforms may be disposed in a plurality of stacks extending in the vertical longitudinal direction of the chamber 1. While two stacks are shown, typically several more stacks are loaded into a CVI/CVD reaction chamber. The stacks are supported by tooling comprising bottom and intermediate loading trays 5a and 5b having holes 5 to allow gas to pass through, together with spacers 5c between the trays. The entire assembly rests on the bottom 1a of the chamber.

In order to densify the preforms 2, a gas containing a precursor of carbon, such as propane mixed with methane or natural gas, is injected into the chamber 1. The gas may be conveyed by a plurality of ducts 6 which open out into the bottom portion of the chamber at spaced apart locations. Residual gases are extracted from the top portion of the chamber via ducts 7. In the bottom portion of the chamber, the gas passes through a preheating zone 8 containing perforated preheating plates, prior to reaching the bottom loading tray 5a. The preheating plates are situated in the chamber 1a and are maintained close to the temperature inside the chamber, thereby enabling the gas to be preheated effectively. The inside of the chamber may be heated by a graphite susceptor 9 forming a heater core that is electro-magnetically coupled with an inductor (not shown). The susceptor 9 defines the inside volume of the vertical axis chamber whose bottom 1a has the ducts 6 passing therethrough and whose cover 1b has the ducts 7 passing therethrough. The bottom and the cover are also typically made of graphite, as are the various plates, trays, and spacers contained inside the chamber.

Carbon fiber preforms 2 are densified by depositing pyrolytic carbon therein, produced by decomposing the precursor which is contained in the gas that diffuses inside the accessible internal pores of the preforms. In chamber 1, between preheating zone 8 and outlet ducts 7, the gas flows by passing inside and outside the stacks of carbon fiber preforms 2. In order to allow the gas to access the faces of the preforms 2, they are held apart from one another in each of the stacks by means of spacers 3 which leave spaces 4 between the carbon fiber preforms.

Figure 5:
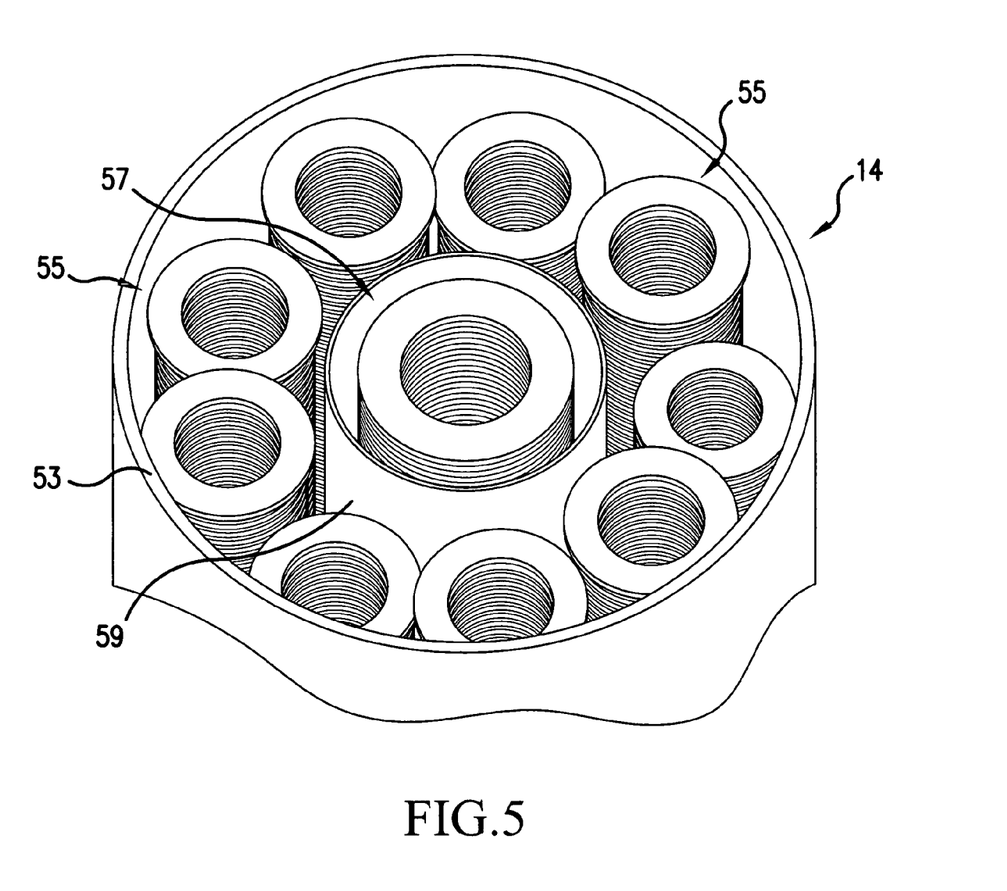
FIG. 5 is a perspective view of an industrial scale CVD/CVI reactor with a central element for improved heat transfer.

FIG. 5 shows a partial perspective view of apparatus 14. Outer and inner walls 53 and 59 each comprises graphite or carbon-carbon composite material. In FIG. 5, graphite or carbon-carbon composite heat distribution element material 57 is shown as completely filling the spaced defined by inner wall 59. Also visible in FIG. 5 are carbon-carbon composite preform stacks 55. In a typical embodiment of apparatus 14, outer wall 3 is 2 inches thick and 57 inches in internal diameter and inner wall 9 is $\frac{1}{16}$-$\frac{1}{2}$ inch thick and 21-22 inches in external diameter. Typical outside diameters of preforms 55 are 11.5 inches and 16 inches.

Carbon Fiber Preform Materials

Carbon fiber preform materials that can be densified in accordance with the present invention are well known as a class. Such materials are described, for instance, in U.S. Pat. Nos. 5,323,523, 5,388,320, 5,705,264, 5,737,821, 5,882,781, and 6,691,393 B2. The disclosure of each of these patents is expressly incorporated by reference in the present application. In addition to nonwoven carbon fiber preforms, this invention may be used with woven carbon fiber-based preforms as well. The carbon fibers themselves are typically derived from polyacrylonitrile (PAN) or pitch. Molded carbon-carbon materials produced from chopped random fiber prepregs may also be densified using the present invention. As those skilled in the art will appreciate, all of the above type of preforms may also contain additives, and/or or friction modifiers such as Si, SiC, Ti, TiC, etc.

Pressure Control Schemes

Figure 6:
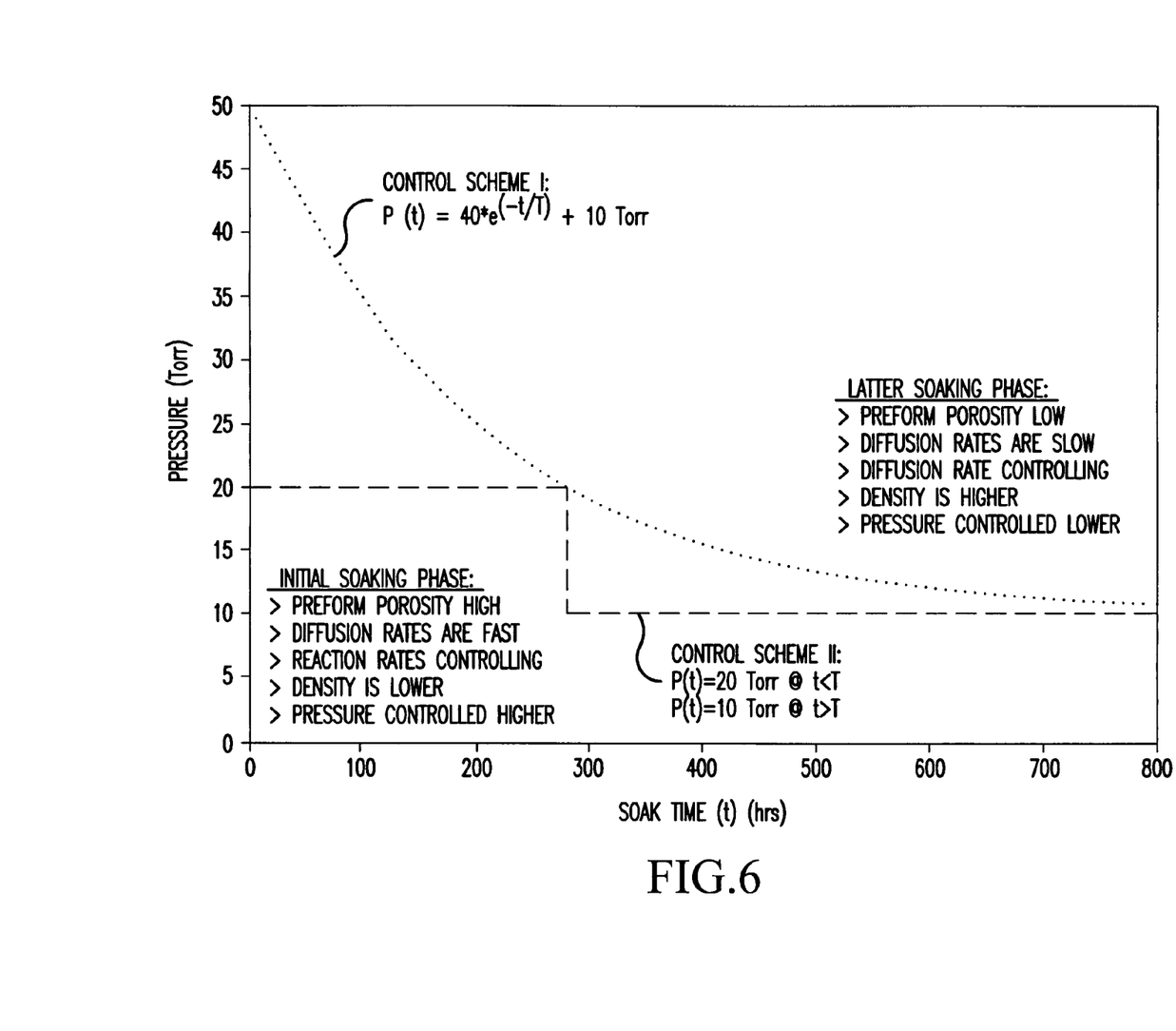
FIG. 6 provides graphs illustrating two different CVD/CVI pressure control schemes in accordance with the present invention.

FIG. 6 illustrates two different pressure control schemes in accordance with the present invention. In Pressure Control Scheme I, gas infiltration pressure during the CVI/CVD processing is lowered at a rate defined by the formula $P(t) = N * e^{(-t/T)} + n$ torr, where $P(t)$ is the gas infiltration pressure in torr, N is a number from 10 through 50, which number corresponds to the initial gas infiltration pressure, "e" is a the natural logarithm base, "t" is elapsed time since the start of the CVI/CVD process, "T" is the empirically-determined time at which infiltration gas diffusion rate rather than infiltration reaction rate begins to control the rate of density increase in the chemical vapor infiltration of the particular carbon fiber preform being densified, and n is a number greater than 0 but less than N, which number corresponds to a degree of lowering of gas infiltration pressure during deposition of deposable carbon material into the porous substrate. This pressure control scheme may be a continuous function, or it may be implemented in a step-wise algorithm in a PLC (programmable logic controller). Pressure Control Scheme II is illustrative of another stepwise approach to implementing the present invention. In pressure Control Scheme II, CVI/CVD gas infiltration is carried out at 20 torr until the empirically-determined time "T" at which infiltration gas diffusion rate rather than infiltration gas pressure begins to control the rate of density increase in the CVI/CVD processing for the particular carbon-carbon fiber preform being densified. At time "T", that gas infiltration pressure is lowered to and maintained at 10 torr for the remainder of the CVI/CVD processing cycle. Of course those skilled in the art will appreciate that other specific pressures and numbers of pressure decrease steps can be used in accordance with the present invention. For instance, one may start CVI/CVD processing at a pressure of 25 torr, and at time T reduce the pressure by 5 torr and continue processing for 100 hours and then reduce the pressure by another 5 torr and continue processing for another 100 hours, and so on until the desired density has been imparted to the carbon fiber preform being densified in the CVI/CVD processing procedure of this invention.

Figure 7:
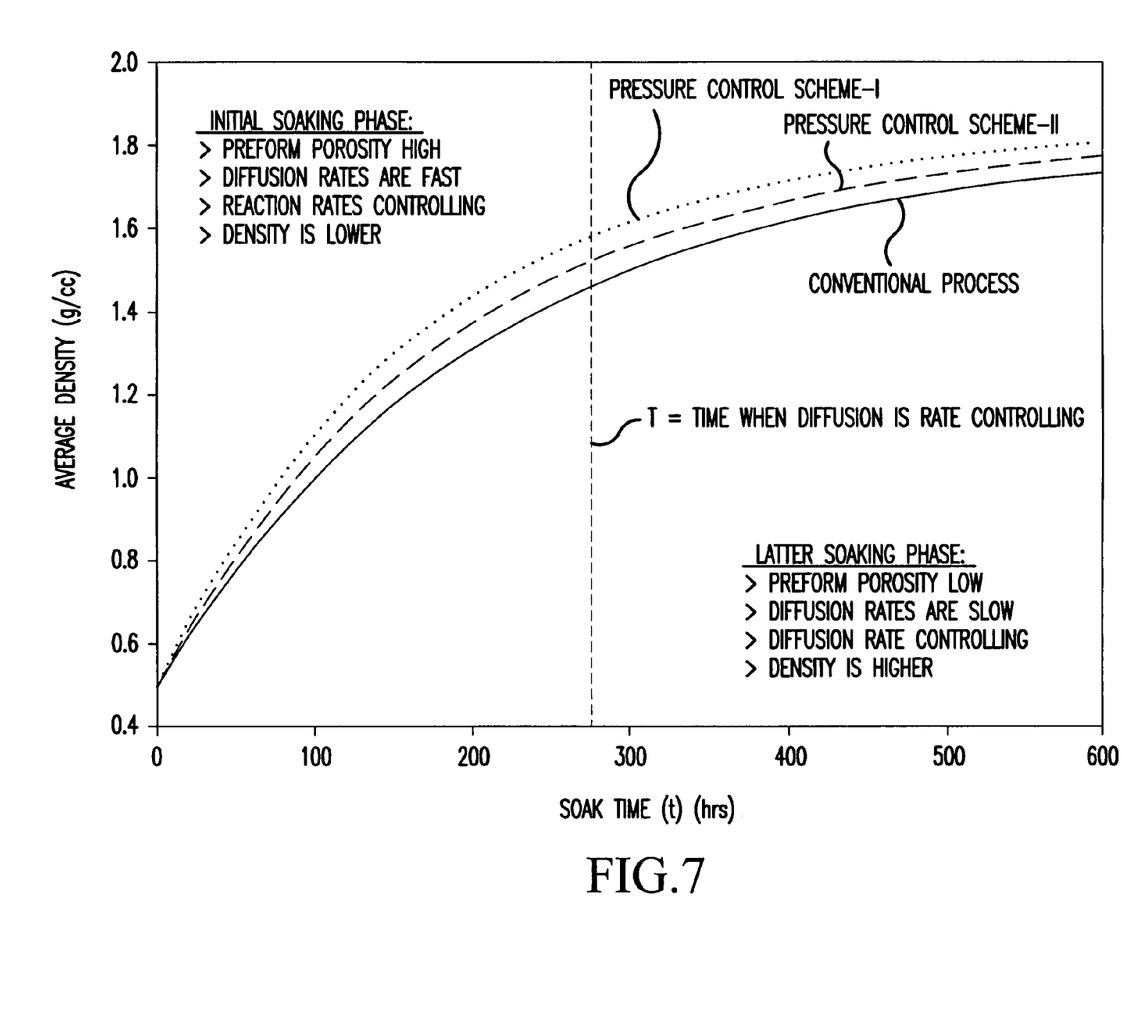
FIG. 7 is a graphic illustration of density increase as a function of soak time in various different approaches to CVD/CVI processing.

FIG. 7 compares density results provided by the present invention with density results provided by conventional processing. As can be seen from the comparison, the present invention achieves a given density after a shorter CVI/CVD processing ("soak time") than does conventional processing. This advantage is seen with stepwise Pressure Control Scheme II, and is even more pronounced with the constant pressure decrease of Pressure Control Scheme I.

The present invention has been described herein in terms of several embodiments. Additions and modifications to these embodiments will become apparent to those skilled in the relevant arts upon a reading of the foregoing description. All such obvious modifications and additions are intended to be included within the present invention to the extent they fall within the scope of the several claims appended hereto.

We claim:

1. A method of chemical vapor infiltration of a deposable carbon material into a porous carbon fiber preform in a reaction zone, the method comprising:
    situating the porous carbon fiber preform in the reaction zone;
    providing a linear flow of a reactant gas comprising deposable carbon material in the reaction zone at an initial reaction pressure of at most 50 torr to produce deposition of the deposable carbon material into the preform; and
    adjusting the pressure of the gas to reaction pressures lower than said initial reaction pressure while deposable carbon material continues to be deposited into the porous carbon fiber preform,
    wherein gas infiltration pressure during the chemical vapor infiltration is lowered at a rate defined by the formula $$P(t)=N*e^{(-t/T)}+n \text{torr},$$

where $P(t)$ is the gas infiltration pressure in torr, N is a number from 10 through 50 corresponding to the initial gas infiltration pressure, "e" is a the natural logarithm base, "t" is elapsed time since the start of the CVI/CVD process, "T" is the empirically-determined time at which infiltration gas diffusion rate rather than infiltration gas pressure begins to control the rate of density increase in the chemical vapor infiltration of the particular carbon fiber preform being densified, and n is a number 0<n<N corresponding to a degree of lowering of gas infiltration pressure during deposition of deposable carbon material into the porous carbon fiber preform.

2. The method of claim 1, wherein N is 40 and n is 10.

3. The method of claim 1 wherein the linear flow is directed from a bottom of the reaction zone to a top of the reaction zone.

4. The method of claim 3 wherein the linear flow of reactant gas is free of admixed inert gas.

5. The method of claim 3 wherein multiple porous carbon fiber preforms are adjusted apart from one another in such a way as to provide widths of equal spacing therebetween.

6. The method of claim 1 wherein the educt gas comprises methane or natural gas.

7. The method of claim 6 wherein the educt gas further comprises propane gas.

8. The method of claim 7 wherein the ratio by volume of methane or natural gas to propane gas is greater than 5:1.

9. The method of claim 1 wherein the temperature in the reaction zone is in the range 1000° C. to 1200° C.

10. A method of chemical vapor infiltration of a disposable carbon material into porous carbon fiber preform in a reaction zone, the method comprising:
    situating the porous carbon fiber preform in the reaction zone;
    providing a linear flow of a reactant gas comprising deposable carbon material in the reaction zone at an initial reaction pressure of at most 50 torr to produce deposition of the deposable carbon material into the preform, wherein the linear flow is adjusted to have a flow rate such that no more than 5% of the disposable material is deposited into the porous carbon fiber preform; and
    adjusting the pressure of the gas to reaction pressures lower than said initial reaction pressure while deposable carbon material continues to be deposited into the porous carbon fiber preform,
    wherein gas infiltration pressure during the chemical vapor infiltration is lowered at a rate defined by the formula $$P(t)=N*e^{(-t/T)}+n\text{torr},$$

where $P(t)$ is the gas infiltration pressure in torr, N is a number from 10 through 50 corresponding to the initial gas infiltration pressure, "e" is a the natural logarithm base, "t" is elapsed time since the start of the CVI/CVD process, "T" is the empirically-determined time at which infiltration gas diffusion rate rather than infiltration gas pressure begins to control the rate of density increase in the chemical vapor infiltration of the particular carbon fiber preform being densified, and n is a number 0<n<N corresponding to a degree of lowering of gas infiltration pressure during deposition of deposable carbon material into the porous carbon fiber preform.

* * * * *